United States Patent [19]
Kawakami et al.

[11] Patent Number: 4,633,189
[45] Date of Patent: Dec. 30, 1986

[54] NF TONE CONTROL CIRCUIT

[75] Inventors: Yasuo Kawakami; Katsushi Kitamura, both of Saitama, Japan

[73] Assignee: Pioneer Electronic Corporation, Tokyo, Japan

[21] Appl. No.: 787,822

[22] Filed: Oct. 15, 1985

[30] Foreign Application Priority Data

Oct. 15, 1984 [JP] Japan .......................... 59-155498[U]

[51] Int. Cl.$^4$ .............................................. H03F 1/34
[52] U.S. Cl. ...................................... 330/97; 330/107; 330/108; 330/290; 330/294; 330/305; 333/28 T
[58] Field of Search ................. 330/97, 107, 108, 109, 330/259, 290, 294, 304, 305; 333/28 T; 381/98, 101, 102; 455/267

[56] References Cited

U.S. PATENT DOCUMENTS 3,419,811 12/1968 Von Recklinghausen et al. .................................... 330/290 X
3,816,661 6/1974 Husztz et al. .................. 333/28 T X Primary Examiner—James B. Mullins
Attorney, Agent, or Firm—Sughrue, Mion, Zinn, Macpeak & Seas

[57] ABSTRACT

An NF (Negative Feedback) tone control circuit in which a circuit gain of unity is maintained for a flat frequency response without the addition of active components. A voltage divider circuit which divides only an a.c. component of the output of an operational circuit is connected between the output of the operational amplifier circuit and a variable impedance circuit, the latter including the variable resistors of the tone control circuit.

3 Claims, 5 Drawing Figures

NF TONE CONTROL CIRCUIT

BACKGROUND OF THE INVENTION

The present invention relates to an NF tone control circuit.

A tone control circuit for adjusting the tone of reproduced signals is often used in audio equipment such as a preamplifier provided for amplifying the reproduced audio signals. In commonly used bass and treble control circuits, a circuit known as an NF (Negative Feedback) circuit plays the leading role.

FIG. 1 illustrates a conventional NF tone control circuit, which includes an operational amplifier 1 having a negative feedback loop; a bias power supply 2 for applying a bias voltage to the noninverting input terminal of the operational amplifier 1; a bass control network 3 composed of resistors $R_1$ and $R_2$, a capacitor $C_1$, and a variable resistor $VR_1$; and a treble control network 4 composed of resistors $R_3$ and $R_4$, capacitors $C_2$ and $C_3$, and a variable resistor $VR_2$.

Since the operational amplifier 1, which is an active element, is used with a ground-type power supply in the case of the above-described circuit, a bias voltage must be applied to the noninverting input terminal of the operational amplifier 1, which bias voltage is set close to one-half the power source voltage $+V_{cc}$, to obtain a maximum dynamic range. Consequently, a voltage approximately equal to about one-half the power source voltage $+V_{cc}$, namely, the bias voltage, is present at the output of the operational amplifier 1, and that voltage is passed back to the noninverting input terminal of the operational amplifier 1 through the network 3 and 4. The operational amplifier 1 is thus kept in an active state.

The stressing (boosting)-to-attenuating (cutting) ratio in the tone control circuit is normally set equal. For this reason, the variable resistors $VR_1$ and $VR_2$ are usually set so that the frequency response is flat with the variable resistors set at their center mechanical positions. Usually, linear variable resistors $VR_1$ and $VR_2$ are employed where the resistance changes linearly with the amount of rotation of the shaft of the variable resistors. Also, preferably, $R_1=R_2$, $R_3=R_4$ and $C_2=C_3$.

In the circuit thus arranged, as mentioned above, the wiper terminals of the variable resistors $VR_1$ and $VR_2$ are located at the middle points of the resistors where the response of the circuit is made flat. Since $R_1=R_2$, $R_3=R_4$ and $C_2=C_3$, the impedances $Z_A$ and $Z_B$ (see FIG. 2) of the network 3 and 4 are equal when the inputs and outputs thereof are viewed from the output point 5 of the networks 3 and 4. The flat frequency response gain is expressed by $-Z_B/Z_A$. No voltage gain is present under the condition of $Z_B=Z_A$ because the gain is $-1$ (where the minus sign indicates 180° phase reversal).

In case more gain is needed when the frequency response is flat, an amplifier has conventionally been arranged in the preceding or following stage of the tone control circuit. However, this approach has the disadvantages of high cost due to the presence of the parts constituting the amplifier, difficulties of assembly and inspection, packaging space restrictions, and a reduced circuit reliability.

SUMMARY OF THE INVENTION

The present invention is intended to eliminate the above-described drawbacks, and it is therefore an object of the invention to provide an NF tone control circuit with a gain of 1 or greater without an additional amplifier, even when the frequency response is flat.

The NF tone control circuit according to the present invention is characterized in that a voltage divider circuit for dividing only the a.c. component of the output voltage of an operational amplifier is connected between the output of the operational amplifier, which has a feedback loop, and a reference potential, and the divided voltage produced by the voltage divider circuit is fed back to one of the inputs of the operational amplifier.

DETAILED DESCRIPTION OF THE PREFERRED EMBODIMENTS

Figure 1:
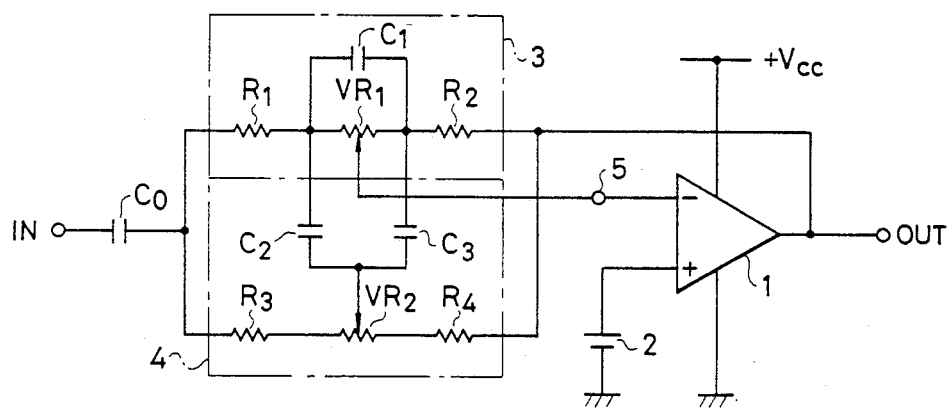
FIG. 1 is a circuit diagram of a conventional NF tone control circuit.

Referring to the drawings, preferred embodiments of the present invention will be described in detail.

Figure 3:
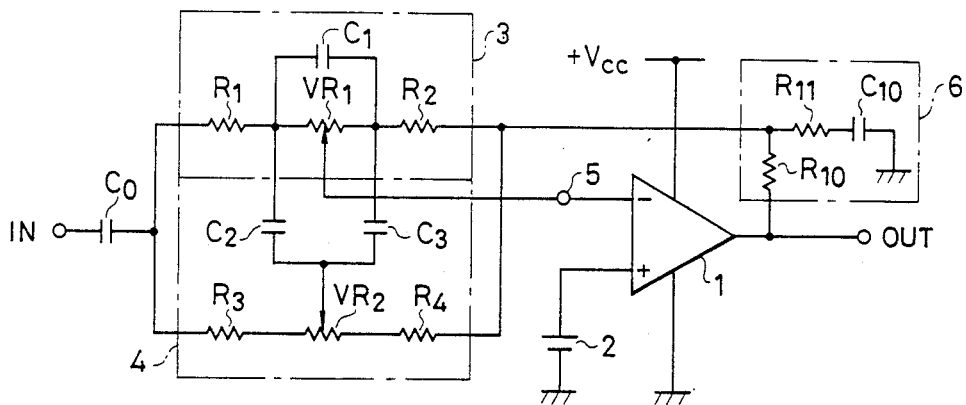
FIG. 3 is a circuit diagram illustrating an embodiment of the present invention.

FIG. 3 is a circuit diagram illustrating a preferred embodiment of the present invention, wherein like reference numerals designate like elements in FIG. 1.

In this embodiment, a voltage divider circuit 6 composed of resistors $R_{10}$ and $R_{11}$ and a capacitor $C_{10}$ is connected between the output of an operational amplifier 1 and ground (reference potential), whereby the divided voltage produced by the voltage divider circuit 6 is fed back to the inverting input terminal of the operational amplifier 1 through networks 3 and 4. The rest of the circuit is the same as that of FIG. 1.

The capacitor $C_{10}$ is provided so that the voltage divider circuit 6 divides only the a.c. component, and not the d.c. component, of the output voltage of the operational amplifier 1. The capacitance value of the capacitor $C_{10}$ is selected so that the impedance of the capacitor $C_{10}$ is substantially lower than that of the resistances $R_{10}$ and $R_{11}$ in the frequency range where the circuit is used.

The resistances of $R_{10}$ and $R_{11}$ are preferably, but not necessarily, values smaller than the impedances of the networks 3 and 4 and yet larger than the smallest impedance with which the operational amplifier 1 can be driven.

The operation of the tone control circuit thus arranged will be described with reference to the equivalent circuit diagram of FIG. 4. It is assumed that the frequency response thereof is flat.

Figure 2:
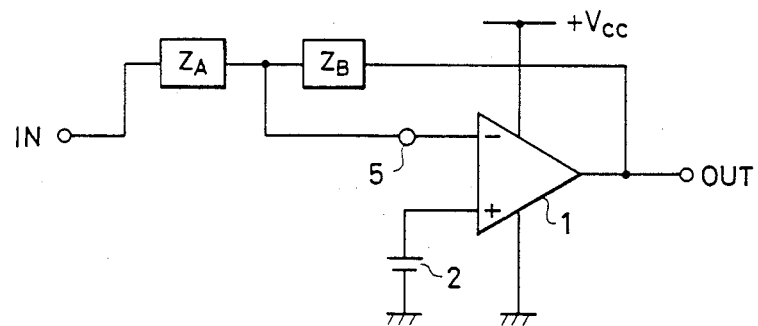
FIG. 2 is a circuit diagram illustrating an equivalent circuit of the circuit of FIG. 1.
Figure 4:
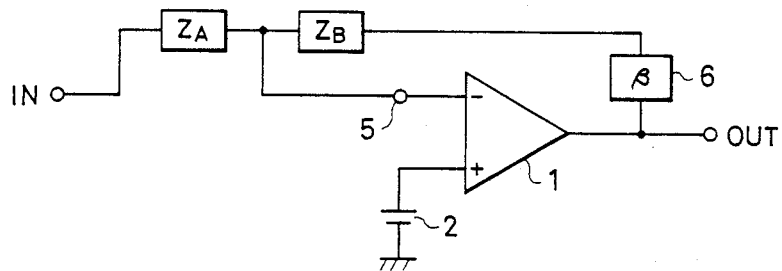
FIG. 4 is a circuit diagram illustrating an equivalent circuit of the circuit of FIG. 3.

In FIG. 4, the impedances of the networks 3 and 4 are, as in the case of FIG. 2, $Z_A$ and $Z_B$ when the frequency response is flat. Given that the input voltage is $e_I$, the current $i_A$ flowing in from the input side is $e_I/Z_A$. On the other hand, given that the output voltage is $e_O$, the voltage applied to $Z_B$ will be $e_O \cdot \beta$, for a voltage division ratio of $\beta$, because the output voltage $e_O$ has been divided by the voltage divider circuit 6. As a result, the current $i_B$ flowing through $Z_B$ becomes $e_O \cdot \beta / Z_B$. As the circuit operates to perform inverse amplification, feedback is carried out by $e_0$ toward $-i_B=i_A$. Thus the following equation may be written:

$$-e_O\beta/Z_B = e_I/Z_A \tag{1}$$

From Eq. (1) above, the gain $e_O/e_I$ is:

$$e_O/e_I = -Z_B/(Z_A \cdot \beta). \tag{2}$$

Since $Z_A=Z_B$, when the frequency response is flat, Eq. (2) can be rearranged as follows:

$$e_O/e_I = -1/\beta, \tag{3}$$

and the ratio is:

$$\beta = (R_{11}+Z_C)/(R_{10}+R_{11}+Z_C). \tag{4}$$

$Z_C$ is the impedance of the capacitor $C_{10}$. Eq. (4) is rearranged as follows:

$$\beta = R_{11}/(R_{10}+R_{11}). \tag{5}$$

$Z_C$ is selected so that $Z_C > R_{10}$, $R_{11}$ as aforementioned. Substitution of Eq. (5) into Eq. (3) gives the gain:

$$e_O/E_I = -(R_{10}+R_{11}/R_{11}), \tag{6}$$

which value is $-1$ or greater. In other words, there is obtained for a gain a negative number times as great as the voltage division ratio of the voltage divider circuit 6.

The negative feedback of not only a.c. but also d.c. components must be carried out. As aforementioned, the amplification function is not available unless the operational amplifier 1 is kept in an active state by supplying a voltage equal to the bias voltage to the inverting input terminal of the operational amplifier 1. Since the voltage divider circuit 6 is not allowed to divide the a.c. component due to the presence of the capacitor $C_{10}$, 100% feedback is carried out as in the case of the conventional circuit shown in FIG. 1. However, an a.c. component only is inputted to the tone control circuit by the capacitor $C_{10}$ because the tone control circuit functions as an amplifier on receiving a d.c. signal through the input terminal. This is also the case with the circuit of FIG. 1.

In the case of an operational amplifier 1 using both negative and positive power supplies without the capacitor $C_{10}$, the d.c. drift portion of the operational amplifier 1 is multiplied by the inverse (1/62) of the voltage division ratio of the voltage divider circuit 6 so that the dynamic range becomes narrow. On the other hand, because the capacitor $C_{10}$ is provided in this embodiment to allow 100% d.c. drift feedback, only the drift portion appears at the output of the operational amplifier 1, whereby reduction of the dynamic range is minimized.

As an a.c. impedance is added to the voltage divider circuit 6 in series, it affects the settings of the variable resistors $VR_1$ and $VR_2$, providing a flat frequency response at shifted mechanical positions thereof. In order to reduce this effect, the impedance of the divided voltage should be lowered and those of the control networks 3 and 4 raised.

Although bass and treble tone control circuits were referred to in the above-described embodiment, the present invention is also applicable to a selective tone control circuit. The selective tone control circuit has a relatively narrow frequency band centered around a particular frequency for boosting and cutting purposes. A graphic equalizer employs a plurality of such selective tone control circuits.

Figure 5:
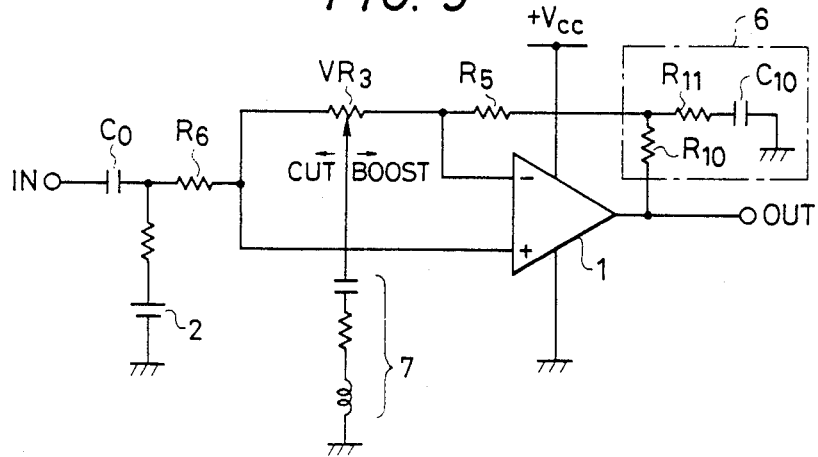
FIG. 5 is a circuit diagram illustrating another embodiment of the present invention.

FIG. 5 illustrates an example wherein the present invention is applied to a selective tone control circuit. Conventionally, $R_5=R_6$ to obtain a flat frequency response at an equal boosting-to-cutting ratio and at the center mechanical position of the variable resistor $VR_3$. When the frequency response is flat, a resistor $R_5$, the variable resistor $VR_3$, a resistor $R_6$, and a resonance network 7 are balanced so that the gain of the circuit is $-1$. However, the gain in this embodiment can be made to be $-1$ or greater when the frequency response is flat by inserting the voltage divider circuit 6 in the feedback loop. A description of the principles of the operation thereof will be omitted as it is the same as that of the preceding example.

As set forth above, the NF tone control circuit according to the present invention provided with an operational amplifier and operated to change its frequency response through feedback is capable of providing a gain of 1 or greater while the frequency response is held flat because a voltage divider circuit for dividing only the a.c. component of the output voltage of the operational amplifier is inserted in the feedback loop. Moreover, because only resistors and a capacitor (passive elements) are required as circuit elements to be newly added to the conventional circuit in order to obtain a gain of 1 or greater, not only is the increase in cost for parts and assembly reduced, but also effects on product durability and reliability are minimized.

We claim:

1. In an NF tone control circuit including an operational amplifier, a feedback loop for feeding back an output voltage of said operational amplifier to an input thereof, and a variable impedance circuit provided between an input terminal of said tone control circuit and said input of said operational amplifier and also in said feedback loop, the improvement comprising: a voltage divider circuit connected between an output of said operational amplifier and a reference potential and dividing only an a.c. component of said output voltage of said operational amplifier, said voltage divider circuit comprising first and second resistors connected in series between said output of said operational amplifier and said reference potential and a capacitor connected between the series connection of said first and second resistors and said reference potential, and means for feeding the divided voltage from said voltage divider circuit to an input of said operational amplifier.

2. The NF tone control circuit of claim 1, wherein, at a frequency at which said tone control circuit is used, an impedance of said capacitor is substantially smaller than resistance values of said first and second resistors.

3. The NF tone control circuit of claim 1, wherein said resistance values of said resistors are smaller than an impedance value of said variable impedance circuit.

* * * * *